(12) United States Patent
Na (10) Patent No.: US 8,144,542 B2
(45) Date of Patent: Mar. 27, 2012

(54) SEMICONDUCTOR MEMORY APPARATUS AND METHOD FOR OPERATING THE SAME

(75) Inventor: Kwang-Jin Na, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 450 days.

(21) Appl. No.: 12/494,733

(22) Filed: Jun. 30, 2009

(65) Prior Publication Data

US 2010/0310029 A1 Dec. 9, 2010

(30) Foreign Application Priority Data

Jun. 3, 2009 (KR) .................. 10-2009-0048956

(51) Int. Cl.
*G11C 8/00* (2006.01)

(52) U.S. Cl. ............. 365/233.1; 365/233.11; 365/233.5; 365/194

(58) Field of Classification Search ............... 365/233.1, 365/233.11, 233.5, 194, 198
See application file for complete search history.

(56) References Cited

U.S. PATENT DOCUMENTS

| | | | |
|---|---|---|---|
| 7,272,055 B2* | 9/2007 | Kishimoto et al. | 365/194 |
| 7,782,105 B2* | 8/2010 | Lee et al. | 327/158 |
| 7,859,939 B2* | 12/2010 | Joo et al. | 365/233.1 |
| 7,889,594 B2* | 2/2011 | Yoon et al. | 365/233.1 |

FOREIGN PATENT DOCUMENTS

| | | |
|---|---|---|
| KR | 1020000023294 | 4/2000 |
| KR | 1020070018477 | 2/2007 |

OTHER PUBLICATIONS

Notice of Allowance issued from Korean Intellectual Property Office on Nov. 30, 2010.

* cited by examiner

*Primary Examiner* — Tuan T Nguyen
*Assistant Examiner* — Toan Le
(74) *Attorney, Agent, or Firm* — IP & T Group LLP (57) ABSTRACT

A semiconductor memory apparatus includes a clock input unit configured to receive a system clock and a data clock, a data clock phase regulation unit configured to regulate a frequency of the data clock, and delay the data clock by a delay varied in accordance with a training information signal, and a clock phase comparison unit configured to compare a phase of an output clock of the data clock phase regulation unit with a phase of the system clock, and generate the training information signal according to a result of the comparison.

21 Claims, 5 Drawing Sheets

SEMICONDUCTOR MEMORY APPARATUS AND METHOD FOR OPERATING THE SAME

CROSS-REFERENCE TO RELATED APPLICATIONS

The present application claims priority of Korean Patent Application No. 10-2009-0048956, filed on Jun. 3, 2009, the disclosure of which is incorporated herein by reference in its entirety.

BACKGROUND OF THE INVENTION

The present invention relates to a semiconductor design technology, and more particularly, to a high-speed semiconductor memory apparatus. More particularly, the present invention relates to a high-speed semiconductor memory apparatus capable of autonomously performing a clock alignment training therein.

A semiconductor memory apparatus stores data in a system including a plurality of semiconductor memory apparatuses. When a data processing apparatus, for example, a memory control unit (MCU), requests data, a semiconductor memory apparatus outputs data corresponding to an address inputted from the data requesting apparatus, or stores data provided from the data requesting apparatus in a location corresponding to the address.

To this end, a high-speed memory apparatus is designed to input/output two data between a rising edge and a falling edge, and input/output two data between the falling edge and the following rising edge in a system clock applied from the outside. That is, a high-speed memory apparatus is designed to input/output four data in a cycle of a system clock.

However, since the system clock has only two states—logic high or logic low, a data clock having a frequency two times faster than a system clock is required to input/output four data in a cycle. That is, a dedicated clock for data input/output is required.

Accordingly, a high-speed semiconductor memory apparatus uses a system clock as a reference clock when transmitting/receiving an address and a command, and uses a data clock as a reference clock when inputting/outputting data, thereby controlling the data clock to have a frequency two times higher than that of the system clock.

That is, four data may be inputted/outputted in a cycle of a system clock by allowing two cycles of the data clock to be repeated during a cycle of the system clock, and allowing data input/output to be generated in a rising edge and a falling edge of the data clock.

Unlike a conventional DDR synchronization memory apparatus using a single system clock as a reference in order to perform a read or write operation, a high-speed semiconductor memory apparatus uses two clocks having different frequencies to transmit/receive data for the read or write operation.

However, if phases of the system clock and the data clock are not aligned, timings for delivering the operation command and the address and references for the data are not aligned. This means that the high-speed semiconductor memory apparatus may not operate normally.

Accordingly, an interface training operation between a semiconductor memory apparatus and a data processing apparatus must be performed at the initial stage for normal operation of a high-speed semiconductor memory apparatus.

The interface training operation is for training the high-speed semiconductor memory apparatus so as to operate at a timing point when an interface for delivering commands, addresses, and data is optimized before normal operation is performed between the semiconductor apparatus and the data processing apparatus.

The interface training is divided into an address training, a clock alignment training (WCK2CK training), a read training, and a write training. An operation of aligning a data clock and a system clock is performed in the clock alignment training.

Figure 1:
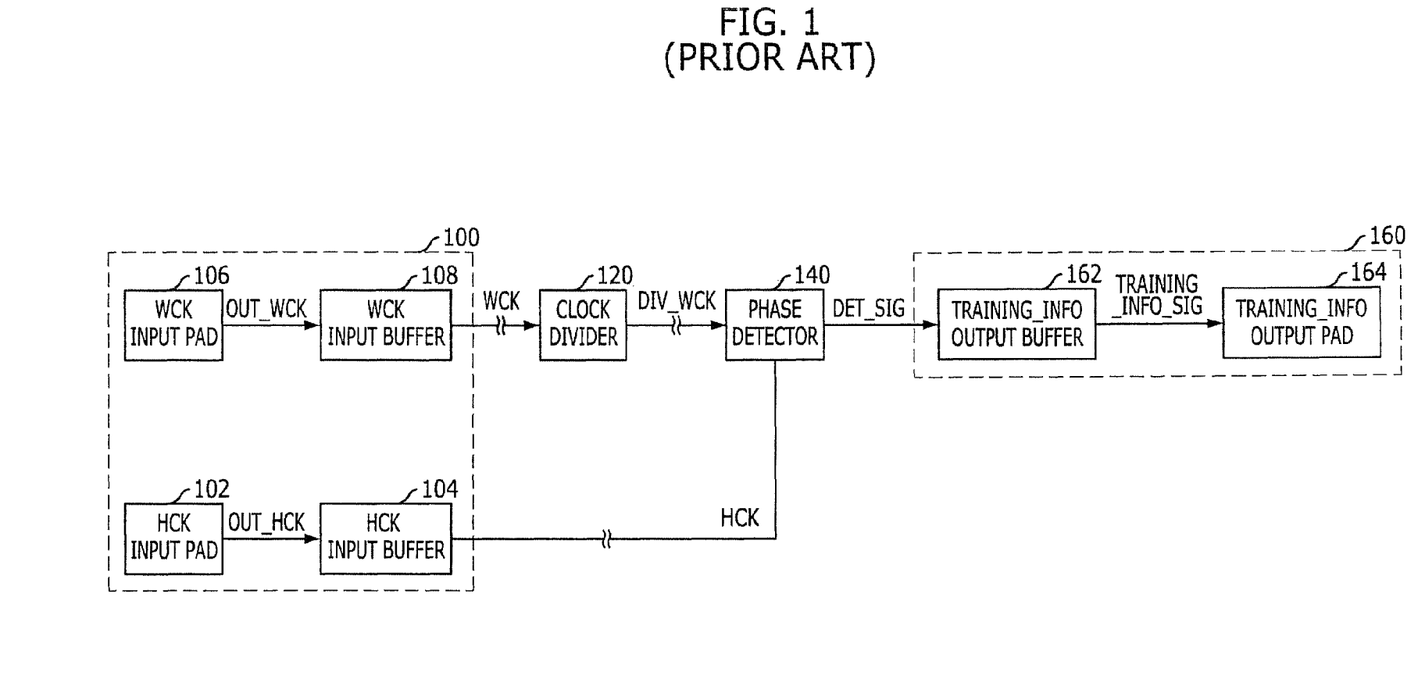
FIG. 1 is a block diagram illustrating a typical circuit for performing a clock alignment training.

FIG. 1 is a block diagram illustrating a typical circuit for performing a clock alignment training.

To explain the basic principles of the clock alignment training, a high-speed semiconductor memory apparatus, as described above, receives an address signal and a command signal from an external memory controller based on a system clock HCK, and outputs data stored in the semiconductor memory apparatus to the external memory controller based on a data clock WCK.

If there is a phase difference between the system clock HCK and the data clock WCK, the data stored in the semiconductor memory apparatus arrives at the external memory controller at timings faster or slower than intended timings by a duration corresponding to the phase difference.

Accordingly, a clock alignment training is performed to reduce a phase difference between the system clock HCK and the data clock WCK by detecting the phase difference between the system clock HCK and the data clock WCK, and transmitting the detection result to the external memory controller.

The typical circuit for performing the clock alignment training described in FIG. 1 is a circuit for detecting a system clock HCK and a data clock WCK from an external memory controller, and performing an operation for transmitting the detection result to the external memory controller.

Referring to FIG. 1, the circuit includes a clock input unit 100, a clock division unit 120, a phase detection unit 140, and a signal transmission unit 160. The clock input unit 100 receives a system clock HCK for synchronizing input timing points of an address signal and a command signal, and a data clock WCK (having a higher frequency than the system clock HCK) for synchronizing an input timing point of a data signal received from an external memory controller. The clock division unit 120 divides a frequency of the data clock WCK to generate a data division clock DIV_WCK so that the data division clock DIV_WCK may have the same frequency as the system clock HCK. The phase detection unit 140 detects a phase difference between the system clock HCK and the data division clock DIV_WCK, and generates a detection signal DET_SIG corresponding to the detection result. The signal transmission unit 160 transmits the detection signal DET_SIG as a training information signal TRAINING_INFO_SIG to the external memory controller.

Figure 2:
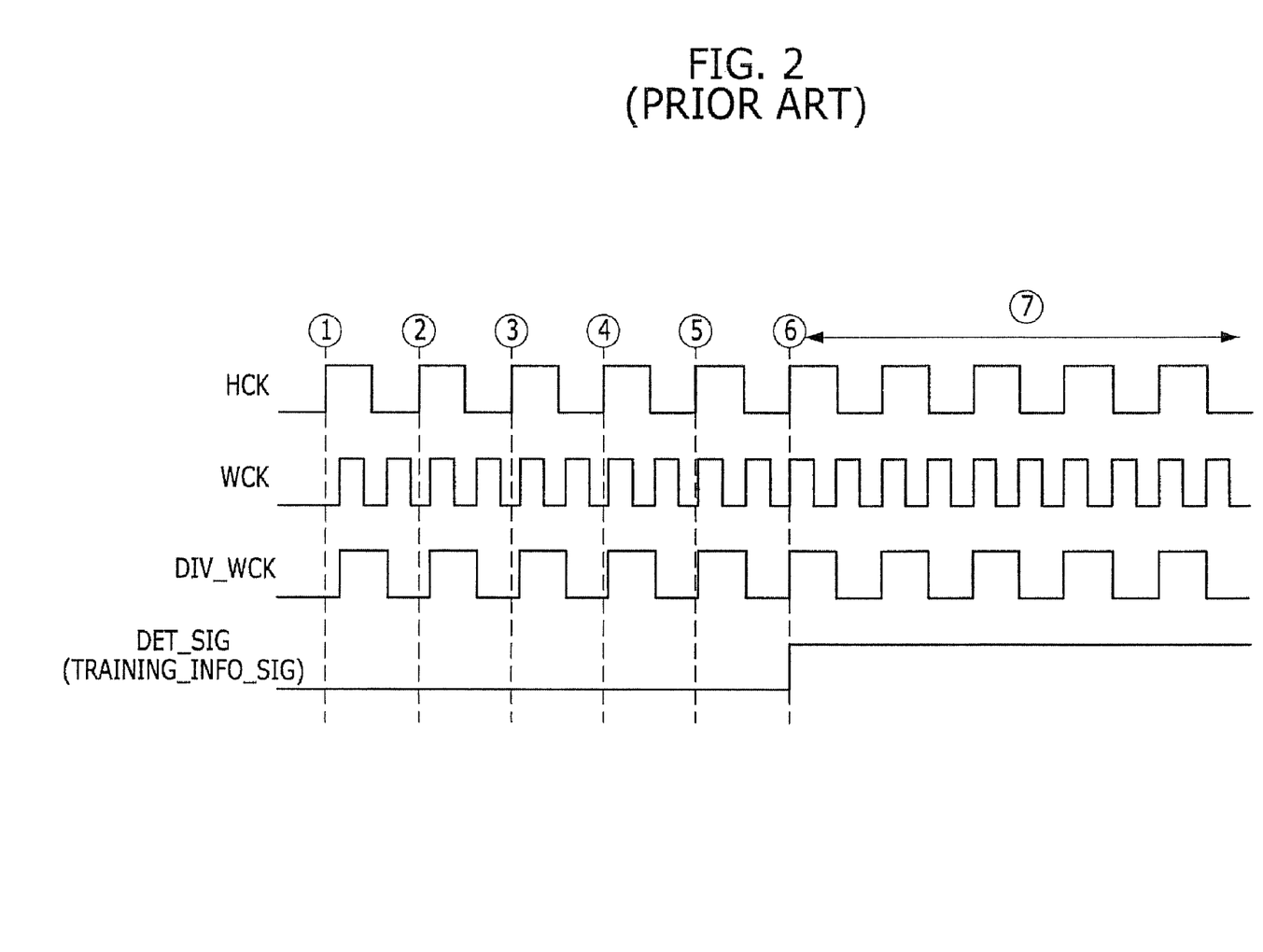
FIG. 2 is a timing diagram illustrating operation waves of a typical circuit for performing a clock alignment training in FIG. 1.

FIG. 2 is a timing diagram illustrating operation waves of a typical circuit for performing a clock alignment training in FIG. 1.

Referring to FIG. 2, while a frequency of a data clock WCK inputted from an external memory controller to a typical circuit for performing a clock alignment training is higher than that of a system clock HCK, a frequency conversion unit 120 converts the frequency of the data clock WCK to be identical to the frequency of the system clock HCK. Accordingly, the frequency of the data clock DIV_WCK outputted from the frequency conversion unit 120 is identical to the frequency of the system clock HCK.

Before a clock alignment training operation is performed (①), clock edges are not synchronized with each other. That is, the phases of the data clocks WCK and DIV_WCK and the system clock HCK are not synchronized with each other before the clock alignment training operation.

After the clock alignment training operation (②, ③, ④, ⑤, and ⑥), the phases of the data clocks WCK and DIV_WCK are changed to synchronize with the phase of the system clock HCK while the phase of the system clock HCK is not changed.

In this case, the phases of the data clocks WCK and DIV_WCK are changed in accordance with a logic level of a training information signal DET_SIG (TRAINING_INFO_SIG) transmitted to the external memory controller by the signal transmission unit 160. That is, because the logic level of the training information signal DET_SIG (TRAINING_INFO_SIG) is continuously a logic low level, the external memory controller changes the phases of the data clocks WCK and DIV_WCK bit by bit to apply to the circuit for performing the clock alignment training.

When the phases of the data clocks WCK and DIV_WCK are synchronized with the phase of the system clock HCK ⑥, the logic level of the training information signal DET_SIG (TRAINING_INFO_SIG) is changed from the logic low level to the logic high level. The phases of the data clocks WCK and DIV_WCK are not changed in the section ⑦ continually maintained at the logic high level. That is, since the logic level of the training information signal DET_SIG (TRAINING_INFO_SIG) is in a logic high state, the external memory controller fixes the phases of the data clocks WCK and DIV_WCK to apply to the circuit for performing the clock alignment training.

In conclusion, the circuit for performing the clock alignment training allows the phase detection unit 140 to continuously compare phases of the data dock WCK and the system clock HCK until the phases of the data clock WCK and the system clock HCK inputted from the external memory controller are synchronized, and transmits the comparison result, i.e. the training information signal DET_SIG (TRAINING_INFO_SIG) to the external memory controller.

However, the clock alignment training operation is disadvantageous in that much time is required until the phase of the data clock WCK is changed and inputted after a training information signal DET_SIG (TRAINING_INFO_SIG) is generated in the semiconductor memory apparatus and transmitted to the external memory controller.

That is, the phase of the data clock WCK is changed and inputted when a certain time elapses after a training information signal DET_SIG (TRAINING_INFO_SIG) is generated in the semiconductor memory apparatus and transmitted to the external memory controller.

Thus, the clock alignment training operation takes time to complete.

Furthermore, in a system sharing a memory such as a dual back memory, an accurate clock alignment training operation may be difficult to obtain when considering a delay skew of a transmission path from a memory controller to each memory.

SUMMARY OF THE INVENTION

An embodiment of the present invention is directed to provide a semiconductor memory apparatus capable of autonomously performing a clock alignment training therein.

In accordance with an aspect of the present invention, there is provided a semiconductor memory apparatus including: a clock input unit configured to receive a system clock and a data clock; a data clock phase regulation unit configured to regulate a frequency of the data clock, and delay the data clock by a delay varied in accordance with a training information signal; and a clock phase comparison unit configured to compare a phase of an output clock of the data clock phase regulation unit with a phase of the system clock, and generate the training information signal according to a result of the comparison.

In accordance with another aspect of the present invention, there is provided a method for operating a semiconductor memory apparatus, the method including: receiving a system clock for synchronizing input timing points of a command signal and an address signal; receiving a data clock for synchronizing input/output timing points of a data signal, the data clock having a higher frequency than a frequency of the system clock; dividing a frequency of the data clock to be identical to the frequency of the system clock; delaying the data clock by a delay varied in accordance with a training information signal; and comparing a phase of the system clock with a phase of the data clock, and generating the training information signal according to a result of the comparison.

DESCRIPTION OF SPECIFIC EMBODIMENTS

Other objects and advantages of the present invention can be understood by the following description, and become apparent with reference to the embodiments of the present invention.

Figure 3:
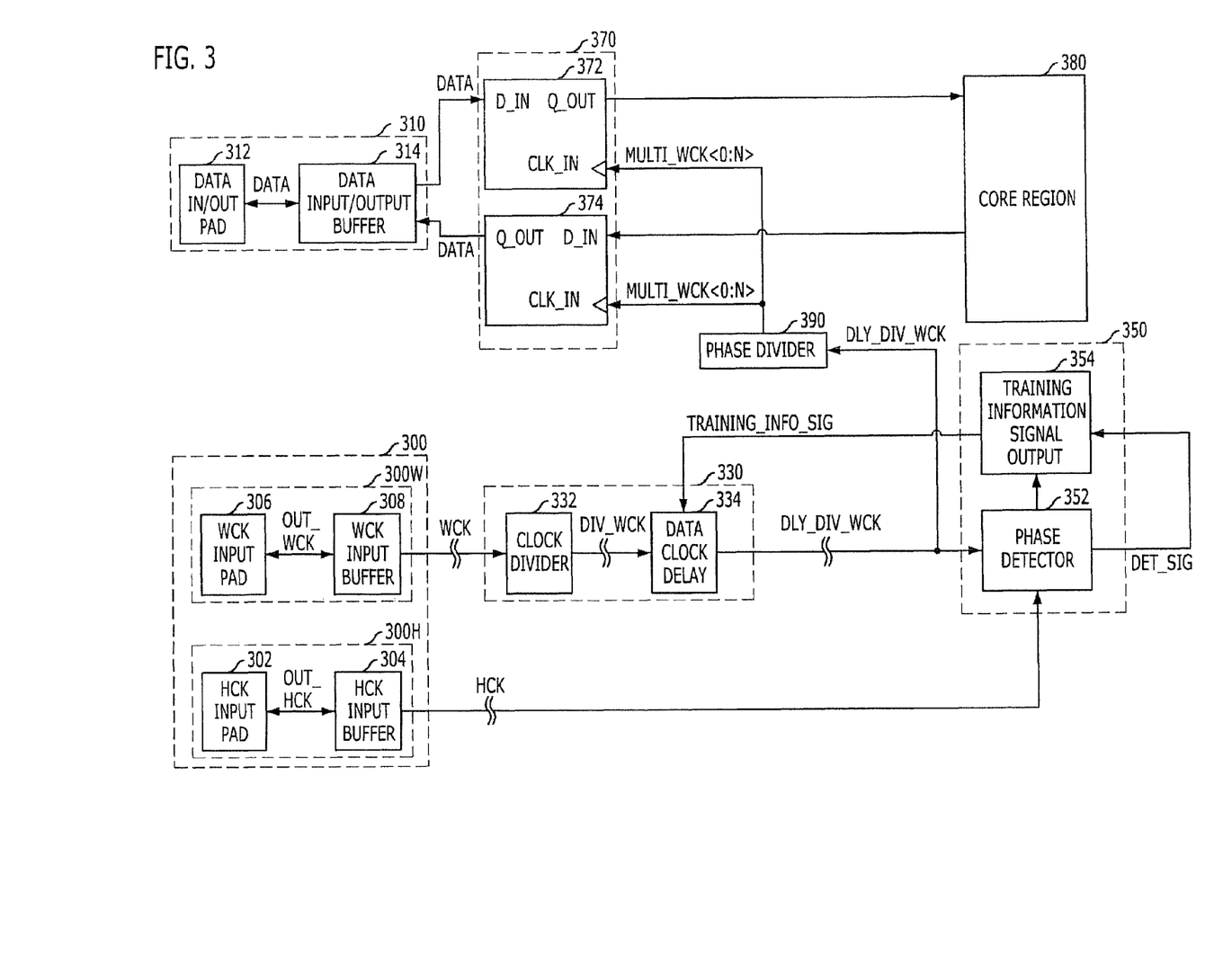
FIG. 3 is a block diagram illustrating a circuit for performing a clock alignment training according to an embodiment of the present invention.

FIG. 3 is a block diagram illustrating a circuit for performing a clock alignment training according to an embodiment of the present invention.

First, basic principles of a clock alignment training according to an embodiment of the present invention will be described as follows.

A high-speed semiconductor memory apparatus according to an embodiment of the present invention receives an address signal and a command signal from an external memory controller based on a system clock HCK, and performs data input/output operations between a core region for storing data in the semiconductor memory apparatus and the external memory controller based on a data clock WCK.

Accordingly, if there is a phase difference between the system clock HCK and the data clock WCK, timings of the data input/output operations between the core region for storing data in the semiconductor memory apparatus and the external memory controller become faster or slower than intended timings by a duration corresponding to the phase difference.

The semiconductor memory apparatus according to the embodiment of the present invention performs an operation to reduce a phase difference between the system clock HCK and the data clock WCK by detecting the phase difference between the system clock HCK and the data clock WCK applied from the external memory controller at the initial operation, and regulating the phase of the data clock WCK applied from the external memory controller according to the detection result.

Unlike a typical circuit for a clock alignment training in FIG. 1, the circuit for performing a clock alignment training described in FIG. 3 does not transmit a result of detecting a phase difference between the system clock HCK and the data clock WCK to the external memory controller.

Referring to FIG. 3, the circuit for a clock alignment training according to an embodiment of the present invention includes a clock input unit 300, a data clock phase regulation unit 330, and a clock phase comparison unit 350.

The clock input unit 300 receives a system clock HCK for synchronizing input timing points of an address signal and a command signal, and a data clock WCK (having a higher frequency than the system clock HCK) for synchronizing input timing points of data signals from an external memory controller. The data clock phase regulation unit 330 regulates a frequency of the data clock WCK, and delays the data clock WCK by a delay varied in accordance with a training information signal TRAINING_INFO_SIG. The clock phase comparison unit 350 compares a phase of an output clock DLY_DIV_WCK of the data clock phase regulation unit 330 with a phase of the system clock HCK, and generates the training information signal TRAINING_INFO_SIG in accordance with the comparison result.

The circuit further includes a phase division unit 390, a data signal alignment unit 370, and a data signal transmission unit 310. The phase division unit 390 receives the output clock DLY_DIV_WCK of the data clock phase regulation unit 330, and divides the phase of the output clock DLY_DIV_WCK to generate a plurality of multisystem clocks MULTI_WCK<0:N> having predetermined phase differences therebetween. The data signal alignment unit 370 aligns a data signal DATA based on the plurality of multisystem clocks MULTI_WCK<0:N>. The data signal transmission unit 310 transmits the data signal DATA outputted from the data signal alignment unit 370 to an external memory controller, or transmits a data signal DATA applied from an external memory controller to the data signal alignment unit 370.

Here, the clock input unit 300 includes a system clock input unit 300H, and a data clock input unit 300W. The system clock input unit 300H receives a clock OUT_HCK for synchronizing input timing points of an address signal and a command signal from the outside, and outputs the clock OUT_HCK as a system clock HCK. The data clock input unit 300W receives a clock OUT_WCK for synchronizing input timing points of data signals from the outside, and outputs the clock OUT_WCK as a data clock WCK.

The system clock input unit 300H includes a system clock input pad 302, and a system clock input buffer 304. The system clock input pad 302 receives a system clock OUT_HCK from an external controller. The system clock input buffer 304 buffers the system clock OUT_HCK delivered from the system clock input pad 302 to output a system clock HCK.

The data clock input unit 300W includes a data clock input pad 306, and a data clock input buffer 308. The data clock input pad 306 receives a data clock OUT_WCK (having a higher frequency than the system clock OUT_HCK from the external controller) from an external controller. The data clock input buffer 308 buffers the data clock OUT_WCK delivered from the data clock input pad 306 to output a data clock WCK.

The data clock phase regulation unit 330 includes a data clock divider 332, and a data clock delay 334. The data clock divider 332 divides the frequency of the data clock WCK. The data clock delay 334 delays an output clock DIV_WCK of the data clock divider 332 by a delay varied in accordance with a training information signal TRAINING_INFO_SIG to output a clock DLY_DIV_WCK.

Unlike those described in FIG. 3, the data clock phase regulation unit 330 may include a data clock delay 334 configured to delay a data clock WCK by a delay varied in accordance with a training information signal TRAINING_INFO_SIG to output a clock DLY_WCK, and a data clock divider 332 configured to divide a frequency of the clock DLY_WCK outputted from the data clock delay 334 to output a clock DIV_DLY_WCK.

That is, two elements included in the data clock phase regulation unit 330, the data clock divider 332 and the data clock delay 334, may be arranged in any order to perform the normal operations.

The phase comparison unit 350 includes a phase detector 352, and a training information signal output 354. The phase detector 352 detects the phase of the clock DLY_DIV_WCK outputted from the data clock regulation unit 330 based on the phase of the system clock HCK. The training information signal output 354 regulates a value of the training information signal TRAINING_INFO_SIG in response to an output signal DET_SIG of the phase detector 352 at predetermined periodic time intervals.

The data signal alignment unit 370 includes a data signal input aligner 372, and a data signal output aligner 374. The data signal input aligner 372 aligns a data signal DATA delivered from an external memory controller through the data signal transmission unit based on a plurality of multisystem clocks MULTI_WCK<0:N> to output to an internal core region 380. The data signal output aligner 374 aligns a data signal DATA outputted from the internal core region 380 based on the plurality of multisystem clocks MULTI_WCK<0:N>, and delivers the data signal DATA to the data signal transmission unit 310, thereby outputting the data signal DATA to the external memory controller.

Figure 5:
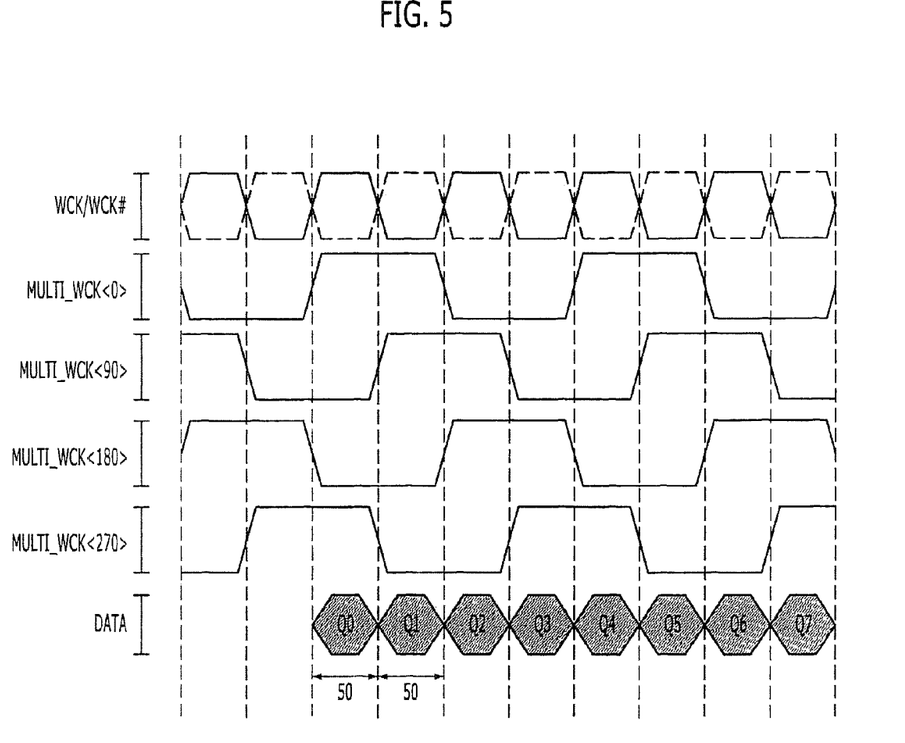
FIG. 5 is a timing diagram illustrating an alignment of data signals based on a plurality of multisystem clocks generated in accordance with data clocks.

For reference, the operation of aligning and transmitting the data signal DATA based on the plurality of multisystem clocks MULTI_WCK<0:N> is a well-known operation, which will be easily understood by referring to FIG. 5. Accordingly, detailed description thereof is omitted.

The data signal transmission unit 310 includes a data signal input/output pad 312, and a data signal input/output buffer 314. The data signal input/output pad 312 inputs/outputs a data signal DATA between an external controller and a semiconductor memory device. The data signal buffer 314 buffers the data signal DATA inputted/outputted through the data signal input/output pad 312.

Figure 4:
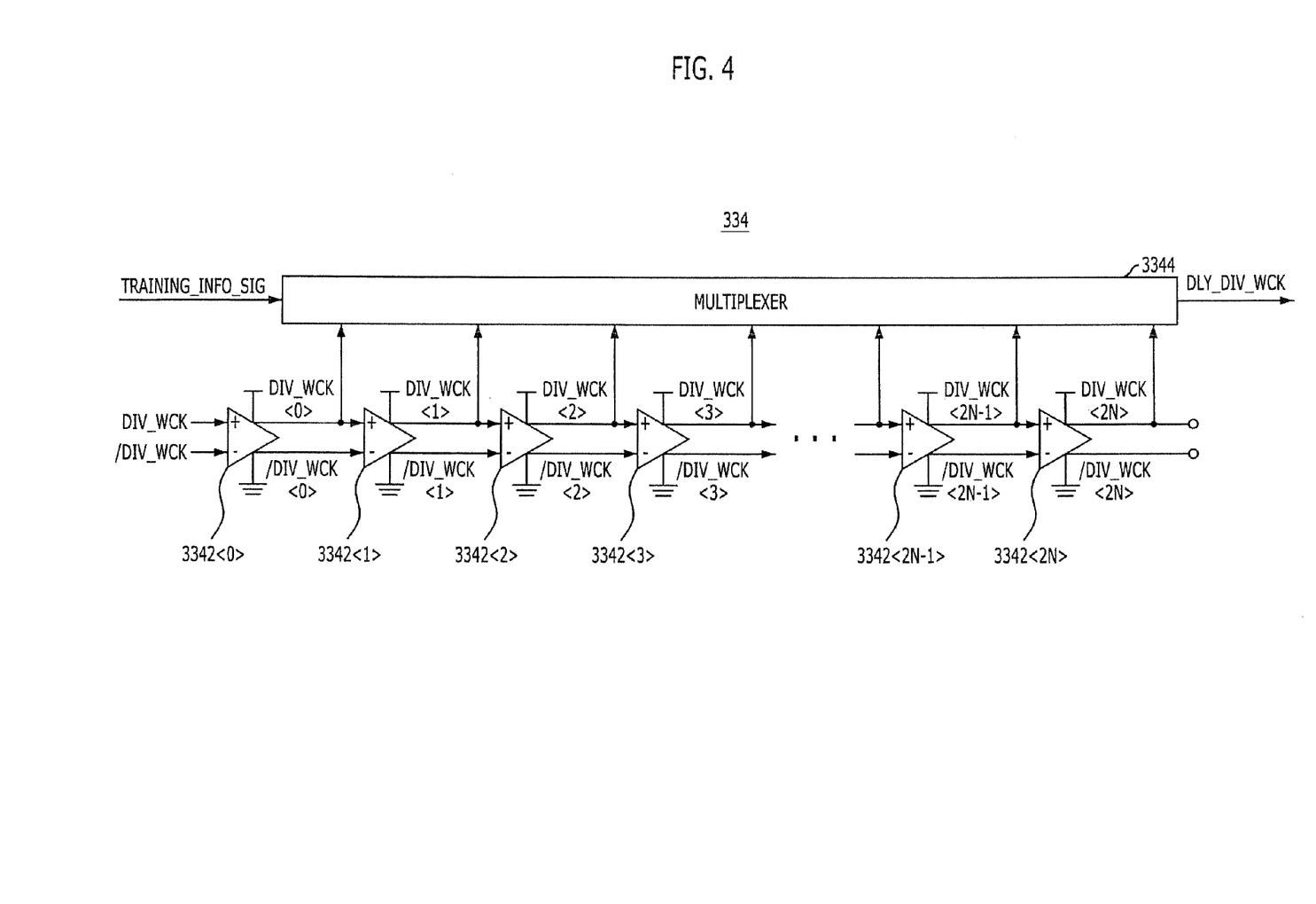
FIG. 4 is a circuit diagram illustrating a data clock delay provided in a data clock phase regulating unit among elements of a circuit for performing a clock alignment training according to an embodiment of the present invention.

FIG. 4 is a circuit diagram illustrating a data clock delay provided in the data clock phase regulation unit among the elements of the circuit for performing a clock alignment training according to an embodiment of the present invention in FIG. 3.

Referring to FIG. 4, the data clock delay 334 provided in the data clock phase regulation unit among the elements of the circuit for performing a clock alignment training according to an embodiment of the present invention includes a plurality of unit delay terminals 3342<0>, 3342<1>, 3342<2>, . . . , 3342<2N-1>, and 3342<2N> connected in series. The data clock delay 334 delays inputted clocks by a method of changing the number of the unit delay terminals used to delay an inputted clock (a clock DIV_WCK outputted from the clock divider 332, or a data clock WCK received from the clock input unit 300) among the plurality of unit delay terminals 3342<0>, 3342<1>, 3342<2>, . . . , 3342<2N-1>, and 3342<2N>, in response to an training information signal TRAINING_INFO_SIG.

More specifically, the data clock delay 334 includes a plurality of unit delay terminals 3342<0>-3342<2N>, and a multiplexer. The plurality of unit delayer terminals 3342<0>-3342<2N> receive an inputted clock DIV_WCK, and a reverse clock/DIV_WCK of the inputted clock DIV_WCK, and delay the inputted clock DIV_WCK and the reverse clock/DIV_WCK by a predetermined delay. The multiplexer 3344 outputs one of clocks DIV_WCK<0>-DIV_WCK<2N> respectively outputted from the plurality of unit delayer terminals 3342<0>-3342<2N> as an output clock, in response to the training information signal TRAINING_INFO_SIG.

Though not directly included in the elements of the circuit for performing the clock alignment training according to the above embodiment of the present invention, a control signal for discriminating between a clock alignment training operation and a normal operation is present in the semiconductor memory apparatus. Generally, a value of the control signal for discriminating between the clock alignment training operation and the normal operation is preset in Memory Register Set (MRS).

For example, elements (the data dock delay 334 provided in the data clock phase regulation unit 330 and the clock phase comparison unit 350) directly related to the clock alignment training operation among the elements of the circuit for performing the clock alignment training according to the embodiment of the present invention directly receive a signal for controlling on/off of the clock alignment training operation.

Hereinafter, an operation of the circuit for performing the clock alignment training according to an embodiment of the present invention will be described.

When a delay is determined to delay inputted clocks DIV_WCK and/DIV_WCK in the data clock delay 334 provided in the data clock phase regulation unit 330, the delay is varied in accordance with a training information signal TRAINING_INFO_SIG.

More specifically, it is assumed that the training information signal TRAINING_INFO_SIG is a code signal including a plurality of bits. If a value of the training information signal TRAINING_INFO_SIG is greater, the inputted clocks DIV_WCK and/DIV_WCK are delayed by a greater delay using the greater number of unit delayer terminals among a plurality of unit delay terminals 3342<0>-3342<2N>. If a value of the training information signal TRAINING_INFO_SIG is smaller, the inputted clocks DIV_WCK and/DIV_WCK are delayed by a smaller delay using the smaller number of unit delayer terminals among the plurality of unit delay terminals 3342<0>-3342<2N>.

It is assumed that the training information signal TRAINING_INFO_SIG is a logic signal having a single bit. In this case, the number of the unit delay terminals inserted between the unit delay terminal 3342<0> receiving a clock and the unit delay terminal outputting a clock among the plurality of unit delay terminals 3342<0>-3342<2N> is increased by a predetermined unit in response to an activated state where the training information signal TRAINING_INFO_SIG applied at predetermined periodic time intervals is logic 'high'. The number of the unit delay terminals inserted between the unit delay terminal 3342<0> receiving a clock and the unit delay terminal outputting a clock among the plurality of unit delay terminals 3342<0>-3342<2N> is decreased by a predetermined unit/number in response to an inactivated state where the training information signal TRAINING_INFO_SIG applied at periodic time intervals is logic 'low'.

When the training information signal TRAINING_INFO_SIG is a logic signal having a single bit, the predetermined period at which the training information signal TRAINING_INFO_SIG is applied becomes a period of comparing a phase of the output clock DLY_DIV_WCK of the data clock phase regulation unit 330 with a phase of the system clock HCK by the clock phase comparison unit 350. For example, since a frequency of the output clock DLY_DIV_WCK of the data clock phase regulation unit 330 may be considered identical to that of the system clock HCK, the logic level of the training information signal TRAINING_INFO_SIG is determined for every cycle of the output clock DLY_DIV_WCK of the data clock phase regulation unit 330 and the system clock HCK.

The meaning of the operation of increasing or decreasing the number of the unit delay terminals inserted between the unit delay terminal 3342<0> receiving a clock and the unit delay terminal outputting a clock among the plurality of unit delay terminals 3342<0>-3342<2N> by a predetermined unit is that the unit delay terminal outputting a clock among the plurality of unit delay terminals 3342<0>-3342<2N> is changed according to the logic level of training information signal TRAINING_INFO_SIG.

The data clock delay 334 provided in the data clock phase regulation unit 330 performs an operation of changing an internal delay in response to the training information signal TRAINING_INFO_SIG only in a training operation mode. Accordingly, in a normal mode other than the training operation mode, the internal delay may be fixed without regard to the value of the training information signal TRAINING_INFO_SIG.

If a duration for delaying inputted clocks DIV_WCK and/DIV_WCK may be appropriately regulated according to the training information signal TRAINING_INFO_SIG in the circuit of the data clock delay 334 described in FIG. 4, any reasonably suitable circuit may be used.

The phase detector 352 among the elements of the clock phase comparison unit 350 outputs a phase detection signal DET_SIG of an activated state of a logic 'high' in response to detecting that a reference edge of the system clock HCK is behind a reference edge of the clock DLY_DIV_WCK outputted from the data clock phase regulation unit 330, and outputs a phase detection signal DET_SIG of an inactivated state of a logic 'low' in response to detecting that the reference edge of the system clock HCK is ahead of the reference edge of the clock DLY_DIV_WCK outputted from the data clock phase regulation unit 330.

In this case, the reference edge of the clock DLY_DIV_WCK outputted from the data clock phase regulation unit 330 may be a rising edge, or a falling edge of the clock DLY_DIV_WCK outputted from the data clock phase regulation unit 330. Similarly, the reference edge of the system clock HCK may be a rising edge, or a falling edge.

In addition, if the training information signal TRAINING_INFO_SIG is a code signal including a plurality of bits in the training information signal output 354 among the elements of the clock phase comparison unit 350, an operation of increasing the value of the training information signal TRAINING_INFO_SIG is performed in response to the state that the phase detection signal DET_SIG inputted at predetermined periodic time intervals is in an activated state of logic 'high', and an operation of decreasing the value of the training information signal TRAINING_INFO_SIG is performed in response to the state that the phase detection signal DET_SIG inputted at predetermined periodic time intervals is in an inactivated state of logic 'low'.

If the training information signal TRAINING_INFO_SIG is a logic signal having a single bit in the training information signal output 354 among the elements of the clock phase comparison unit 350, an operation of outputting a training information signal TRAINING_INFO_SIG activated into a logic 'high' is performed in response to the state that the phase detection signal DET_SIG inputted at predetermined periodic time intervals is in an activated state of logic 'high', and an operation of outputting a training information signal TRAINING_INFO_SIG inactivated into a logic 'low' is performed in response to the state that the phase detection signal DET_SIG inputted at predetermined periodic time intervals is in an inactivated state of logic 'low'.

Although the phases of the data clock WCK and the system clock HCK applied from an external memory controller do not accurately match with each other, the phases may accurately match with each other by the operation of the data clock phase regulation unit 330 and the clock phase comparison unit 350 that are provided in the semiconductor memory apparatus.

Thus, the data clock WCK (the clock DLY_DIV_WCK outputted from the data clock phase regulation unit 330), the phase of which match with the phase of the system clock HCK, plays a role of a reference clock by being divided into a plurality of multisystem clocks when a data signal DATA is inputted/outputted between the internal core region 380 and the external memory controller.

As described above, embodiments of the present invention can perform a clock alignment training operation in a semiconductor apparatus by a method of appropriately delaying a data clock WCK until a phase of a data clock WCK applied from an extern memory controller is synchronized with a phase of a system clock HCK.

Thus, since the external memory controller is not affected by the performance of the clock alignment training operation, duration necessary for the performance of the clock alignment training operation can be minimized.

Additionally, since a control signal for a clock alignment training operation need not be transmitted between the semiconductor memory apparatus and the memory controller, an error that may occur due to transmission of a wrong clock alignment training operation control signal can be prevented.

The semiconductor memory apparatus as described above has an effect of minimizing a time necessary for a clock alignment training operation by performing the clock alignment training operation in the semiconductor memory apparatus.

Furthermore, the semiconductor memory apparatus has an effect of minimizing an error that may occur due to transmission of a control signal for the clock alignment training operation between the semiconductor memory apparatus and a memory controller.

While the present invention has been described with respect to the specific embodiments, it will be apparent to those skilled in the art that various changes and modifications may be made without departing from the spirit and scope of the invention as defined in the following claims.

For example, a logic gate and a transistor exemplified in the above embodiments should be implemented in different locations and types in accordance with the polarity of a signal.

What is claimed is:

1. A semiconductor memory apparatus comprising:
a clock input unit configured to receive a system clock and a data clock;
a data clock phase regulation unit configured to regulate a frequency of the data clock, and delay the data clock by a delay varied in accordance with a training information signal; and
a clock phase comparison unit configured to compare a phase of an output clock of the data clock phase regulation unit with a phase of the system clock, and generate the training information signal according to a result of the comparison.

2. The semiconductor memory apparatus of claim 1, wherein the clock input unit comprises:
a system clock input configured to receive a clock for synchronizing input timing points of an address signal and a command signal from the outside to output the clock as the system clock; and
a data clock input configured to receive a clock for synchronizing an input timing point of a data signal from the outside to output the clock as the data clock.

3. The semiconductor memory apparatus of claim 1, wherein the frequency of the data clock is higher than a frequency of the system clock.

4. The semiconductor memory apparatus of claim 3, wherein the data clock phase regulation unit comprises a data clock delay configured to delay the data clock by the delay varied in accordance with the training information signal.

5. The semiconductor memory apparatus of claim 4, wherein the data clock phase regulation unit further comprises a data clock divider configured to divide a frequency of a clock outputted from the data clock delay.

6. The semiconductor memory apparatus of claim 4, wherein the data clock phase regulation unit further comprises a data clock divider configured to receive the data clock, and divide the data clock to deliver to the data clock delay.

7. The semiconductor memory apparatus of claim 4, wherein the data clock delay comprises a plurality of unit delay terminals connected in series, the number of the unit delay terminals used for delaying an inputted clock being changed in response to the training information signal.

8. The semiconductor memory apparatus of claim 7, wherein the data clock delay is configured to delay the inputted clock by a greater delay using the greater number of the unit delay terminals to output if a value of the training information signal is greater.

9. The semiconductor memory apparatus of claim 8, wherein the data clock delay is configured to delay the inputted clock by a smaller delay using the smaller number of the unit delay terminals to output if a value of the training information signal is smaller.

10. The semiconductor memory apparatus of claim 7, wherein the data clock delay is configured to increase the number of the unit delay terminals existing from a unit delay terminal receiving a clock to a unit delayer terminal outputting a clock by a predetermined unit in response to an activated state of the training information signal applied at predetermined periodic time intervals.

11. The semiconductor memory apparatus of claim 10, wherein the data clock delay is configured to decrease the number of the unit delay terminals existing from a unit delay terminal receiving a clock to a unit delayer terminal outputting a clock by a predetermined unit in response to an inactivated state of the training information signal applied at predetermined periodic time intervals.

12. The semiconductor memory apparatus of claim 1, wherein the clock phase comparison unit comprises:

a phase detector configured to detect the phase of the output clock from the data clock phase regulation unit based on the phase of the system clock; and a training information signal output configured to regulate a value of the training information signal in response to an output signal of the phase detector at predetermined periodic time intervals.

13. The semiconductor memory apparatus of claim 12, wherein the phase detector outputs a phase detection signal of an activated state in response to determining that a reference edge of the system clock is behind a reference edge of the output clock from the data clock phase regulation, and outputs a phase detection signal of an inactivated state in response to determining that the reference edge of the system clock is ahead of the reference edge of the output clock from the data clock phase regulation.

14. The semiconductor memory apparatus of claim 13, wherein the training information signal output increases the value of the training information signal in response to the activated state of the phase detection signal inputted at predetermined periodic time intervals, and decreases the value of the training information signal in response to the inactivated state of the phase detection signal inputted at predetermined periodic time intervals.

15. A method for operating a semiconductor memory apparatus, the method comprising:
    receiving a system clock for synchronizing input timing points of a command signal and an address signal;
    receiving a data clock for synchronizing input/output timing points of a data signal, the data clock having a higher frequency than a frequency of the system clock;
    dividing a frequency of the data clock to be identical to the frequency of the system clock;
    delaying the data clock by a delay varied in accordance with a training information signal; and
    comparing a phase of the system clock with a phase of the data clock, and generating the training information signal according to a result of the comparison.

16. The method of claim 15, wherein the generating of the training information signal comprises detecting a logic level of the data clock from a reference edge of the system clock to output as the training information signal.

17. The method of claim 16, wherein the delaying of the data clock comprises:
    delaying the data clock by increasing the delay by predetermined unit in response to an activated state of the training information signal inputted at predetermined periodic time intervals; and
    delaying the data clock by decreasing the delay by predetermined unit in response to an inactivated state of the training information signal inputted at the predetermined period.

18. The method of claim 15, wherein the generating of the training information signal comprises changing a value of the training information signal by comparing a phase difference between a reference edge of the system clock and a reference edge of the data clock.

19. The method of claim 18, wherein the generating of the training information signal comprises:
    decreasing the value of the training information signal when the reference edge of the data clock is behind the reference edge of the system clock; and
    increasing the value of the training information signal when the reference edge of the data clock is ahead of the reference edge of the system clock.

20. The method of claim 19, wherein the delaying of the data clock comprises:
    delaying the data clock by increasing the delay in response to determining that the value of the training information signal is increased; and
    delaying the data clock by decreasing the delay in response to determining that the value of the training information signal is decreased.

21. The method of claim 15, further comprising:
    generating a plurality of multisystem clocks having phase differences therebetween in response to the data clock, respectively; and
    aligning the data signal based on the plurality of multisystem clock to input/output from/to a memory controller.

* * * * *